United States Patent

Heckner et al.

[11] Patent Number: 5,879,167
[45] Date of Patent: Mar. 9, 1999

[54] CONTACT ELEMENT FOR ANTICIPATORY EARTHING

[75] Inventors: Helmut Heckner, Vilshofen; Werner Spateneder, Pfarrkirchen; Thomas Rickinger, Arnstorf; Hans Flamme, Unterhaching; Petra Eder, Griesbach; Josef Neblich, Wartenberg, all of Germany

[73] Assignee: Knürr-Mechanik für die Elektronik Aktiengesellschaft, München, Germany

[21] Appl. No.: 798,823

[22] Filed: Feb. 12, 1997

[30] Foreign Application Priority Data

Feb. 12, 1996 [DE] Germany ............... 296 02 428 U

[51] Int. Cl.[6] ........................................... H01R 9/09
[52] U.S. Cl. ...................................... 439/64; 439/377
[58] Field of Search ................................ 439/64, 377

[56] References Cited

U.S. PATENT DOCUMENTS 5,022,863  6/1991  Keens et al. .......................... 439/108
5,187,648  2/1993  Ito .......................................... 439/64

Primary Examiner—Steven L. Stephan
Assistant Examiner—T C Patel
Attorney, Agent, or Firm—Evenson, McKeown, Edwards & Lenahan, PLLC

[57] ABSTRACT

A contact element is used for anticipatory earthing of a plug-in module during insertion in guides of a casing or a modular chassis up to plugging in. In order to ensure a reliable and effective protective earthing and a very early conducting away of electrostatic charges during the plugging-in process, a contact element is provided with a clamping area and a holding area. The clamping area is constructed for contact engagement on a circuit board and the holding area is constructed for retaining the contact element on a cross extrusion of the casing or the modular chassis.

12 Claims, 1 Drawing Sheet

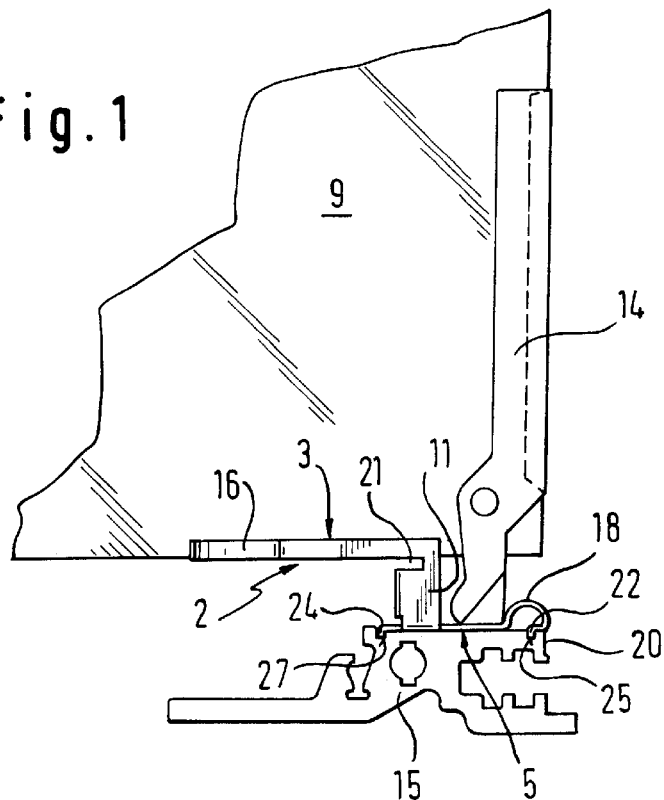
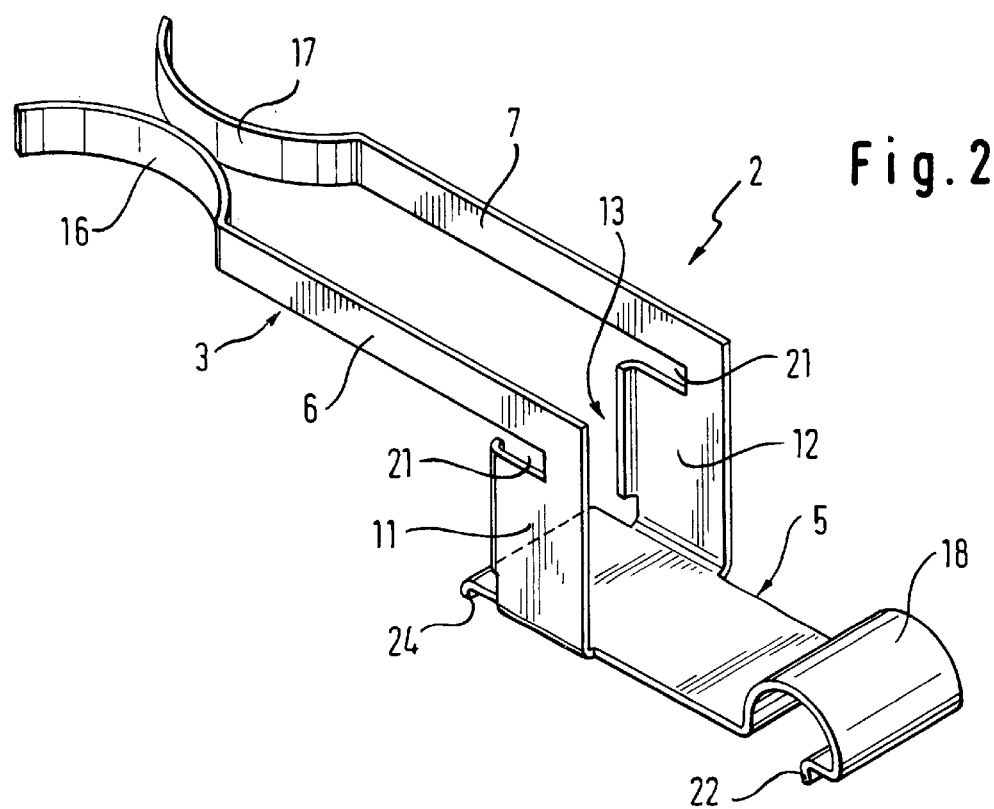

CONTACT ELEMENT FOR ANTICIPATORY EARTHING

FIELD OF THE INVENTION

The present invention relates to a contact element for an anticipatory earthing of a plug-in module, e.g. a circuit board, a breadboard, a plug-in block or a cassette, during insertion sertion in guides of a casing or modular chassis up to the plugging.

BACKGROUND OF THE INVENTION

Apart from the protective earthing of a casing or modular chassis, with which easily contactable, inactive metal parts are connected to a protective conductor, it is also necessary to have an earthing during the plugging process of a plug-in module, which is contacted with a voltage of 50 V.

It is known to equip connectors with an anticipatory earth contact and by means of the latter to produce a connection between a plug-in module and a protective conductor of the modular chassis. The arrangement and construction of the earth contact are intended to permit an electrical connection before contacting of the other live contacts. During pulling of a module, the electrical connection of the anticipatory earth contact must be interrupted last.

In a known protective conductor connection use is made of a contact spring in the vicinity of a conductive guide of a modular chassis. The contact spring is inserted in the guide, which is generally made from plastic, and produces an electrical connection during the inserting of a plug-in module.

It is disadvantageous in this construction that the contact spring is located within the guide rail and during the insertion does not in each case ensure the necessary anticipatory protective earthing.

SUMMARY OF THE INVENTION

The object of the invention is to provide an inexpensively manufacturable and fittable contact element, which ensures a reliable, effective protective earthing and a very early conduction away of electrostatic charges during the plugging of plug-in modules.

According to the invention, for the anticipatory earthing of plug connectors, a contact element is provided with a clamping area and a holding area, the holding area resting or engaging on a cross extrusion of the casing or modular chassis and in particular retained thereon. The contact element is constructed in such manner that an outer edge of the cross extrusion is covered by the holding area and an extremely early protective earthing and conduction away of electrostatic charges is ensured. The clamping area is constructed in such a way that a printed circuit board or a side edge of a plug-in block or a cassette is received and guided and in particular a two-sided engagement on a circuit board or a side edge of a plug-in block or cassette is ensured.

Appropriately the clamping area is formed by two spring-like contact strips, which are arranged parallel to one another and appropriately have a spacing corresponding to the thickness of a circuit board or a side edge of a plugin block or a cassette.

A particularly effective electrical connection is achieved with clamping bows, which are in particular constructed terminally on the contact strips and are directed towards one another.

The horizontally oriented contact strips of the clamping area and the holding area, in the installed position, are essentially located on the cross extrusion of the casing and upstream of a guide, the clamping bow area of the contact strips being above the guide.

For retaining purposes the holding area has at least one front transverse web, which is preferably constructed in complimentary manner to a slot in the cross extrusion of the casing or modular chassis. It is advantageous to provide a further, e.g. rear transverse web, which can also cooperate with a slot of the cross extrusion.

The holding area is substantially horizontal and constructed as a planar contact surface, which rests on a complimentary area of the cross extrusion. In the vicinity of an upper outer edge of the cross extrusion, when the contact element is fitted, there is a protuberance of the holding area, which can in particular be arcuate. This part of the holding area serves for supporting of a push and pull tool and improves the leverage thereof and consequently the pushing and pulling of circuit boards and other plug-in modules.

The contact element constructed in side view as a spread apart Z has between the holding area in the form of the lower crossbar and the spring-like contact strips, which represent the upper crossbar of the Z, connecting webs, which are arranged virtually vertically and with a rear holding area form a U-shaped receptacle for a circuit board or a side edge of a plug-in module. Into said receptacle can also be moved an area of a push and pull tool during the operation thereof.

A particularly advantageous action is provided by the clamping bows, which are located on the ends of the contact strips directed towards the casing interior. As the contact element according to the invention extends up to or over an outer edge of the cross extrusion of the casing or modular chassis, an effective and early anticipatory earthing is guaranted. On pulling the plug-in modules, the electrical connection of the anticipatory contact element is interrupted last. In addition, on early conducting away of electrostatic charges of circuit boards, plug-in modules and their front panels is ensured.

In addition, the construction of the one-piece contact element ensures an inexpensive manufacture and mounting. For example, the contact element can be produced by a punching and bending process.

Appropriately the contact element is made from a conductive material with a good spring action, e.g. copper or a copper alloy.

BRIEF DESCRIPTION OF THE DRAWINGS

The invention is described in greater detail hereinafter relative to the drawings, wherein show:

FIG. 1 In a side view a detail of an modular chassis in the area of a lower front cross extrusion, but without guide.

FIG. 2 A perspective view of the contact element according to the invention.

DETAILED DESCRIPTION OF A PREFERRED EMBODIMENT

FIG. 1 shows a contact element 2 for the anticipatory earthing of a plug connector of a printed circuit board 9.

The contact element 2 is held on a lower cross extrusion 15 of a not shown modular chassis and extends with a holding area 5 and an arcuate protuberance or a support bow 18 constructed on the free end of the holding area 5 up to an outer edge or a front region 20 of the cross extrusion 15.

The arcuate protuberance or support bow 18 with a roughly semicircular cross-section serves as a support point for a push and pull tool 14 during inserting the circuit board 9 into a clamping area 3 of the contact element 2 and then into a not shown guide rail, a pin connector of the circuit board and a socket connector of the not shown modular chassis being connected.

FIG. 1 shows the fixing of the contact element 2 to the cross extrusion 15 of a casing or modular chassis with transverse webs 22, 24 formed on the holding area 5 and which cooperate with complimentary slots 25, 27 of the transverse profile 15. The construction and arrangement of a front transverse web 22 and a rear transverse web 24 can also be gathered from FIG. 2.

The terminal, horizontal orientation of the transverse webs 22, 24 with a substantially horizontally oriented holding area 5 permits a fixing of the contact element 2 by insertion and bracing of the holding area 5 between the slots 25, 27, a further tolerance compensation resulting from the support bow 18.

The perspective representation of a contact element 2 in FIG. 2 shows the construction of said contact element 2 as a spread apart Z.

The holding area 5 has on a region directed towards the not shown casing interior, vertical connecting webs 11, 12. The connecting webs 11, 12 and the holding area 5 between said webs 11, 12 form a U-shaped reception opening 13, which can receive a region of a push and pull tool 14 (FIG. 1) during insertion and pulling of a circuit board 9.

A conductive connection between the circuit board 9 and the contact element 2 is realized by the clamping area 3, as shown in FIG. 1. The clamping area 3 has two contact strips 6, 7 for engagement on both lateral faces of the circuit board 9. By means of terminally constructed, arcuate areas or clamping bows 16, 17, which are directed towards one another, there is a clamping guidance of the circuit board 9 during insertion and extraction and a particularly effective protective earthing is obtained.

The spacing between the contact strips 6, 7 and the resiliently spreadable clamping bows 16, 17 corresponds to the dimensions of a circuit board or a side edge of a cassette or plug-in block.

Recesses 21 in the connecting area between the connecting webs 11, 12 and the contact strips 6, 7 have an advantageous effect. The recesses 21 improve the spring action in the horizontal and vertical direction.

We claim:

1. A contact element for anticipatory earthing during insertion of plug-in modules, particularly circuit boards, breadboards, plug-in blocks and cassettes, in guides of a casing or a modular chassis, comprising:

a clamping area, and a holding area, the clamping area being constructed for contact engagement on any of a circuit board, side edges of a plug-in block and side edges of a cassette, the holding area retaining the contact element on a cross extrusion of the casing or modular chassis, extending up to a front region of the cross extrusion and covering the cross extrusion, the holding area having an arcuate protuberance on a front side end, the arcuate protuberance defining a support point for a push and pull tool during insertion and pull drawing of the plug-in modules, and the holding area having a front transverse web and a rear transverse web respectively formed on a front region of the arcuate protuberance and a rear region of the holding area, said front transverse web and said rear transverse web both protruding toward the cross extrusion for engaging in respective slots of the cross extrusion.

2. A contact element according to claim 1, wherein the clamping area has two parallel contact strips for a two-sided contact engagement on any of the circuit board, the side edges of the plug-in block and the side edges of the cassette.

3. A contact element according to claim 2, wherein the contact strips have clamping bows directed towards one another and forming a clamping guide.

4. A contact element according to claim 2, wherein the contact strips are provided with terminal and resiliently constructed clamping bows.

5. A contact element according to claim 2, wherein the contact strips are connected via connecting webs to the holding area.

6. A contact element according to claim 5, wherein the connecting webs are positioned vertically and form, with a rear part of the holding area, an approximately U-shaped receiving area for said push and pull tool.

7. A contact element according to claim 6, wherein in a side view the contact element constitutes a spread apart Z, the clamping area forming an upper crossbar of the Z, the holding area forming a lower crossbar of the Z and the vertical connecting webs forming a middle bar of the Z.

8. A contact element according to claim 6, wherein a spacing between the connecting webs corresponds to a thickness of one of the circuit board, a side edge of the plug-in block and a side edge of the cassette.

9. A contact element according to claim 1, wherein the contact element is made from a conductive material.

10. A contact element according to claim 1, wherein said contact element is constructed in one piece by a punching and bending process.

11. A contact element according to claim 9, wherein said conductive material is copper.

12. A contact element according to claim 1, wherein the cross extrusion is a lower cross extrusion extending between walls of said casing or modular chassis.

* * * * *